(12) United States Patent
Liu

(10) Patent No.: US 9,947,868 B2
(45) Date of Patent: Apr. 17, 2018

(54) BACK PLATE CLAMPING DEVICE, ALIGNMENT DEVICE AND EVAPORATION EQUIPMENT

(71) Applicants: BOE TECHNOLOGY GROUP CO., LTD., Beijing (CN); Ordos Yuansheng Optoelectronics Co., Ltd., Ordos, Inner Mongolia (CN)

(72) Inventor: Yang Liu, Beijing (CN)

(73) Assignees: BOE TECHNOLOGY GROUP CO., LTD., Beijing (CN); Ordos Yuansheng Optoelectronics Co., Ltd., Ordos, Inner Mongolia (CN)

( * ) Notice: Subject to any disclaimer, the term of this patent is extended or adjusted under 35 U.S.C. 154(b) by 0 days.

(21) Appl. No.: 15/209,591

(22) Filed: Jul. 13, 2016

(65) Prior Publication Data

US 2017/0110663 A1    Apr. 20, 2017

(30) Foreign Application Priority Data

Oct. 16, 2015  (CN) .......................... 2015 1 0674536

(51) Int. Cl.
C23C 14/50 (2006.01)
H01L 51/00 (2006.01)
(Continued)

(52) U.S. Cl.
CPC .......... H01L 51/0012 (2013.01); C23C 14/50 (2013.01); H01L 27/3262 (2013.01);
(Continued)

(58) Field of Classification Search
CPC .......... H01L 21/68; C23C 14/50; B25B 11/00
See application file for complete search history.

(56) References Cited

U.S. PATENT DOCUMENTS 186,262 A * 1/1877 McAleer ................ B26D 7/015
269/291
957,780 A * 5/1910 Leaver, Jr. ........... B23Q 16/001
269/317
(Continued)

FOREIGN PATENT DOCUMENTS

| CN | 1694236 A | 11/2005 |
| JP | 2004353084 A | 12/2004 |
| JP | 2013155419 A * | 8/2013 |

OTHER PUBLICATIONS

First Chinese Office Action, for Chinese Patent Application No. 201510674536.6, dated Apr. 1, 2017, 9 pages.

Primary Examiner — Christopher M Koehler
Assistant Examiner — Tyrone V Hall, Jr.
(74) Attorney, Agent, or Firm — Kinney & Lange, P.A.

(57) ABSTRACT

Embodiments of the present invention relate to the field of display technology and disclose a back plate clamping device, an alignment device and an evaporation equipment. In one embodiment, a back plate clamping device includes a framework, an upper clamping plate mounted to the framework, and a lower clamping plate assembly. The lower clamping plate assembly includes a stand, a plurality of support plates and a plurality of elastic support structures that are provided in an one-to-one correspondence with the support plates. A surface of each support plate facing away from the corresponding elastic support structure is formed with a supporting face, and, each support plate is mounted to the stand and is movable in a direction perpendicular to a plane where the supporting face is located. And, the stand is mounted to the framework and is movable in the direction perpendicular to the plane.

9 Claims, 3 Drawing Sheets

(51) Int. Cl.
*H01L 51/56* (2006.01)
*H01L 27/32* (2006.01)
*H01L 27/12* (2006.01)
*H01L 29/786* (2006.01)

(52) U.S. Cl.
CPC ............ *H01L 51/001* (2013.01); *H01L 51/56* (2013.01); *H01L 27/1222* (2013.01); *H01L 29/78672* (2013.01); *H01L 2227/323* (2013.01)

(56) References Cited

U.S. PATENT DOCUMENTS

| | | | | |
|---|---|---|---|---|
| 1,254,044 A | * | 1/1918 | Johnson | B25B 5/14 269/154 |
| 2,189,086 A | * | 2/1940 | Seagren | B21D 43/26 269/317 |
| 2,488,205 A | * | 11/1949 | Kopczyniski | B21D 28/04 100/266 |
| 3,064,715 A | * | 11/1962 | Bland | G01S 1/72 156/556 |
| 3,665,795 A | * | 5/1972 | Mayer | B21D 28/04 83/268 |
| 4,733,632 A | * | 3/1988 | Ohmi | H01L 21/68707 118/500 |
| 5,215,134 A | * | 6/1993 | Gudeman | B23Q 9/0042 144/137 |
| 5,301,726 A | * | 4/1994 | Wojcik | B23Q 3/002 144/250.18 |
| 6,558,489 B2 | * | 5/2003 | Dolker | B23Q 1/032 156/360 |
| 7,605,962 B2 | * | 10/2009 | Yoder | H05K 7/1053 359/198.1 |
| 7,735,710 B2 | * | 6/2010 | Kurita | H01L 21/68 228/49.4 |
| 8,341,823 B1 | * | 1/2013 | Maciejewski | G02B 23/22 269/254 CS |
| 8,608,148 B2 | * | 12/2013 | Ruf | B29C 33/305 269/10 |
| 2004/0004676 A1 | * | 1/2004 | Kim | H04N 9/3141 348/787 |
| 2013/0049277 A1 | * | 2/2013 | Nie | B23P 19/10 269/315 |

* cited by examiner

BACK PLATE CLAMPING DEVICE, ALIGNMENT DEVICE AND EVAPORATION EQUIPMENT

CROSS-REFERENCE TO RELATED APPLICATION

This application claims the benefit of Chinese Patent Application No. 201510674536.6 filed on Oct. 16, 2015 in the State Intellectual Property Office of China, the whole disclosure of which is incorporated herein by reference.

BACKGROUND

Technical Field

Embodiments of the present invention relates to the field of display technology, and particularly to a back plate clamping device, an alignment device and an evaporation equipment.

Description of the Related Art

In OLED (organic electroluminescence) display field, currently, due to its self-luminescence property, OLED has the advantages of high visibility and brightness, low voltage demand and high power saved efficiency, quick response, lightweight, smaller thickness, simple structure and low cost, etc., and thus is regarded as one of the most promising products in twenty-first century. As being one of the OLED displays, AMOLED (active matrix organic light emitting diode) display is a device, which is manufactured by vacuum evaporating OLED material, according to certain evaporation process, onto a LTPS (low-temperature polysilicon) back plate plated with ITO (indium tin oxide), and by forming units for generations of three primary colors including R (red), G (green) and B (blue) by virtue of patterns on FMM (fine metal). This technology is now mature primarily and achieves mass productions.

During a vacuum evaporation, alignment between the FMM and the LTPS back plate should be implemented firstly. In an evaporation equipment alignment system, a back plate clamping device is used for clamping the back plate. Conventional clamping device clamps the back plate by using many finger-liked back plate clamping units, these back plate clamping units, which are independent of each other by certain distances, are fixed by bolts. After a long time use, the fixations of these back plate clamping units can be not firm enough and thus loose, which will cause lager pressure on surfaces of the back plate clamping units contacting with the back plate. Due to different degrees of tightness of the bolt fixations during the mounting, these back plate clamping units can offset, which causes partial overpressures and thus will damage the back plate during the clamping. Moreover, the LTPS back plate is prone to be broken into fragments when suffering from the increased pressure, since its thickness is of only 0.5 mm. Disposing of these fragments within the vacuum equipment is difficult and needs a prolonged fragment disposing time (of about 10 h), which greatly reduces its production capacity.

SUMMARY

There is provided a back plate clamping device comprising: a framework, an upper clamping plate mounted to the framework, and a lower clamping plate assembly comprising a stand, a plurality of support plates and a plurality of elastic support structures that are provided in an one-to-one correspondence with the support plates, wherein, each of the elastic support structures is positioned between a corresponding one of the support plates and the stand and is connected to the corresponding one of the support plates and the stand;

a surface of each of the support plates facing away from the corresponding elastic support structure is formed with a supporting face for supporting a back plate, and, each of the support plates is mounted to the stand and is movable in a direction perpendicular to a plane where the supporting face is located; and the stand is mounted to the framework and is movable in the direction perpendicular to the plane.

There is further provided an alignment device comprising the abovementioned back plate clamping device.

There is further provided an evaporation equipment comprising the abovementioned alignment device.

DETAILED DESCRIPTION OF THE EMBODIMENTS

Technical solutions according to embodiments of the present invention will be described hereinafter in detail and completely with reference to the attached drawings. Obviously, the embodiments illustrated in these drawings are only some of embodiments of the present invention, instead of all of the embodiments of the present invention. For those skilled in the art, other embodiments achieved by referring to the following embodiments without involving any inventive steps fall into the scope of the present invention.

Figure 1:
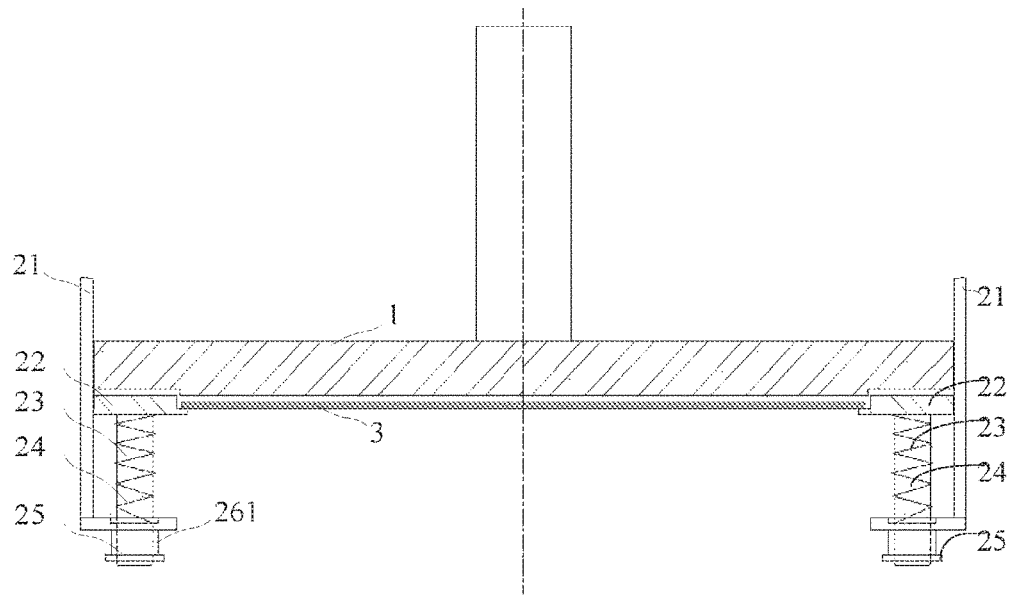
FIG. 1 is a sectional view of a back plate clamping device according to an embodiment of the present invention, without clamping a back plate.
Figure 2:
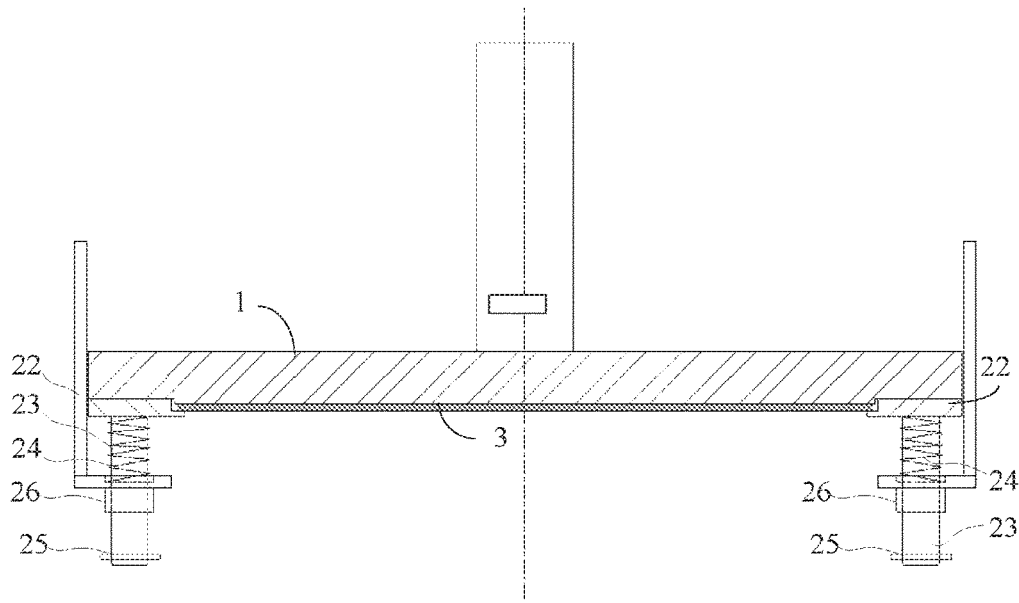
FIG. 2 is a sectional view of the back plate clamping device according to the embodiment of the present invention, with clamping a back plate.
Figure 3:
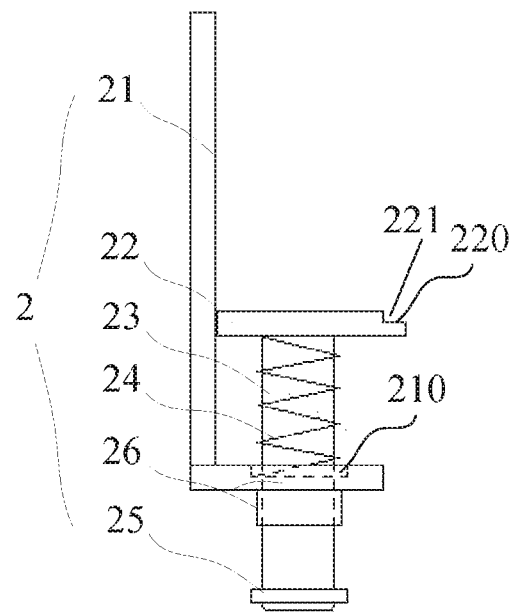
FIG. 3 is a structural schematic view of a lower clamping plate assembly of a back plate clamping device according to an embodiment of the present invention during its operational state.

Referring to FIG. 1, FIG. 2, FIG. 3, FIG. 4 and FIG. 5, there is provided a back plate clamping device comprising a framework (not shown), an upper clamping plate 1 mounted to the framework, and a lower clamping plate assembly 2 (as shown in FIG. 3). The lower clamping plate assembly 2 comprises a stand 21, a plurality of support plates 22 and a plurality of elastic support structures 24 that are in an one-to-one correspondence with the support plates. Each of the elastic support structures 24 is positioned between a corresponding one of the support plates 22 and the stand 21 and is connected to the corresponding one of the support plates 22 and the stand 24. A supporting face 220 for supporting a back plate 3 is formed at a surface of each of the support plates 22 facing away from the corresponding elastic support structure 24, and, each of the support plates 22 is mounted to the stand 21 and is movable in a direction perpendicular to a plane where the supporting face 220 is located; and, the stand 21 is mounted to the framework and is movable in the direction perpendicular to the plane.

When the abovementioned back plate clamping device is in an operational process, a back plate 3 is placed onto the supporting face 220, and, the lower clamping plate assembly 2 is moved upwardly along the framework. When the back plate 3 gets in contact with the upper clamping plate 1, the stand 21 continues to be moved so that the support plate 22 will move downwardly relative to the stand 21 in a direction perpendicular to the back plate 3, and the elastic support structure 24 between the stand 21 and the support plate 22 is forced to be compressed. This movement is finished until the stand 21 reaches a predetermined location. At the predetermined location, an elastic force generated by compression of the elastic support structure 24 is not enough to damage the back plate 3, while all of the periphery of the whole back plate 3 gets into contact with support plates 22, which ensures that the suffered stress is uniform, and the back plate 3 will not be damaged while clamping the back plate 3 since the elastic force from the elastic support structure 24 takes off the overpressure caused by uneven stress. When it is in a separation process, the lower clamping plate assembly 2 is wholly moved downwardly until the back plate 3 is separated from the upper clamping plate 1. The operation is simple.

Accordingly, the abovementioned back plate clamping device allows the back plate 3 to be suffered from a stress evenly during a clamping operation, so as to avoid fragments generated due to partial overpressures caused by uneven stress.

During the operational process of the back plate clamping device, in order to reduce the damage to the back plate 3 from the upper clamping plate 1 and the support plates 22, in a preferred embodiment, as shown in FIG. 1 and FIG. 3, a recess 221 is formed at a marginal portion of each of the support plates 22, and the recess 221 formed at each of the support plates 22 has a bottom collectively forming a part of the supporting face 220. A glass back plate 3 is placed onto the supporting face 220 formed by the bottoms of recesses 221 of these support plates 22. Width and depth of the recess 221 of the support plate 22 will be determined by taking specific shape of the upper clamping plate 1 and whole size of the glass back plate 3 into consideration. Moreover, the depth of the recess 221 should be greater than or equal to the thickness of the back plate 3, and, the back plate 3 can get into contact with the upper clamping plate 1 and the support plate 22 simultaneously when the upper clamping plate 1 is in contact with the support plate 22 of the lower clamping plate assembly. With this recess, a force applied from the upper clamping plate 1 and the support plate 22 onto the back plate 3 will not damage the back plate 3 when the upper clamping plate 1 is in contact with the support plate 22.

During the operational process of the back plate clamping device, in order to ensure that the lower clamping plate assembly 2 is movable in the direction perpendicular to a plane where the supporting face is located, in a preferred embodiment, as shown in FIG. 1, FIG. 2, FIG. 3 and FIG. 4, a guide post 23, of which an extension direction is perpendicular to the supporting face, is provided on a surface of the support plate 22 opposing to the supporting face, and, a guide mechanism 26, which cooperates with the guide post 23 to restrict a moving direction of the support plate 22, is provided on the stand 21. During the operational process of the back plate clamping device, when the back plate 3 is in contact with the upper clamping plate 1, the stand 21 continues to be moved. Since the stand 21 is mounted to the framework and is movable in the direction perpendicular to the plane where the supporting face is located, and the guide post 23 having an extension direction perpendicular to the supporting face is provided on a surface of the support plate 21 opposing to the supporting face, the guide post 23 on the support plate 22 cooperates with the guide mechanism 26 on the stand 21 such that the support plate 21 will move downwardly relative to the stand 21, in a direction perpendicular to the back plate 3. This movement will finish until the stand 21 reaches a predetermined location. Therefore, during the entire operational process of the back plate clamping device, the lower clamping plate assembly 2 is movable always in the direction perpendicular to the plane where the supporting face is, located, so that, when the upper clamping plate 1 is in contact with the support plate 22, both a direction of a contact force applied between the upper clamping plate 1 and the support plate 22 and a direction of a contact force applied by the upper clamping plate 1 and the support plate 22 are perpendicular to the plane where the supporting face is located. As a result, the case where the lower clamping plate assembly 2 is prone to be inclined during its movement is eliminated, thereby not causing damages to the back plate clamping device and the back plate 3 placed in the back plate clamping device.

Figure 4:
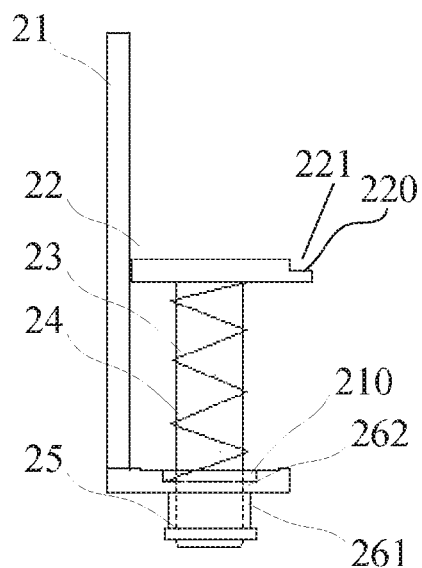
FIG. 4 is a structural schematic view of a lower clamping plate assembly of a back plate clamping device according to an embodiment of the present invention during its free state.
Figure 5:
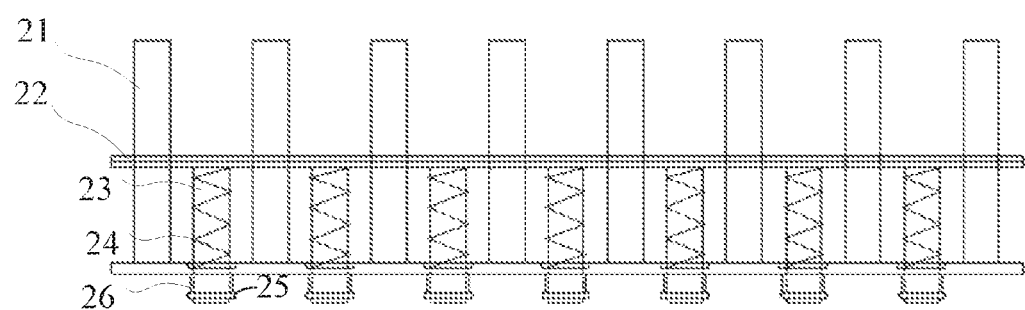
FIG. 5 is a left structural schematic view of the lower clamping plate assembly of the back plate clamping device according to the embodiment of the present invention during its free state, shown in FIG. 4.

Exemplarily, as shown in FIG. 1, FIG. 2 and FIG. 4, the guide mechanism 26 comprises a through hole 262 formed in the stand 21 and a guide sleeve 261 provided on the stand 21, wherein, the guide post 23 passes through the through hole 262 while the guide sleeve 261 fits over the guide post 23. The through hole 262 and the guide sleeve 261 provided on the stand 21 constitute the guide mechanism 26. When the support plate 22 is to move downwardly relative to the stand 21 in the direction perpendicular to the back plate 3, the guide mechanism 26 plays a role of guiding the guide post 23 therein so that the guide post 23 moves in the direction perpendicular to the plane where the supporting face is located, which ensures that the support plate 22 as well as the back plate 3 placed on the support plate 22 are movable in the direction perpendicular to the plane. It will be preferable that sizes of the through hole 262 and the guide sleeve 261 are designed such that the guide post 23 can move smoothly in the through hole 262 and the guide sleeve 261.

Based on an implementation of the abovementioned back plate clamping device, in order to avoid separation of the support plate 22 from the stand 21 when the upper clamping plate 1 is separated from the support plates 22, in a preferred embodiment as shown in FIG. 1, FIG. 2 and FIG. 4, a retraction limiting mechanism 25 is provided at an end of the guide post 23 passing through the guide mechanism 26. When the upper clamping plate 1 is separated from the support plates 22, the whole lower clamping plate assembly 2 is moved downwardly, so the spring located between the support plate 22 and the stand 21 is stretched, but the retraction limiting mechanism 25 at the end of the guide post 23 restricts a distance by which the downward movement travels, thereby ensuring that the stand 21 will not be separated from the support plate 22.

Based on an implementation of the function of the abovementioned back plate clamping device, in order to facilitate assembly and disassembly between the stand 21 and the support plate 22, in a preferred embodiment, the guide post 23 is detachably connected to the support plate 22, and/or, the guide post 23 is detachably connected to the retraction limiting mechanism 25. Since the guide post 23 provided on the support plate 22 is located in the guide mechanism 26 provided on the stand 21, and the retraction limiting mechanism 25 for restricting a retraction travel of the guide post 23 in the guide mechanism 26 is provided at the end of the guide post 23 passing through the guide mechanism 26, at least one of the connection between the guide post 23 and the support plate 22 and the connection between the guide post 23 and the retraction limiting mechanism 25 is a detachable connection. Here, there could be several relationships of the connections among the guide post 23, the support plate 22 and the retraction limiting mechanism 25.

In a first relationship, the guide post 23 is fixedly connected to the retraction limiting mechanism 25, and, the guide post 23 is detachably connected to the support plate 22. When assembling the back plate clamping device, the guide post 23 is firstly inserted into the guide mechanism 26 of the stand 21, and then the guide post 23 is connected to the support plate 22.

In a second relationship, the guide post 23 is fixedly connected to the support plate 22, and, the guide post 23 is detachably connected to the limiting mechanism 25. When assembling the back plate clamping device, the guide post 23 is firstly inserted into the guide mechanism 26 of the stand 21, and then the retraction limiting mechanism 25 is connected to the guide post 23.

In a third relationship, the guide post 23 is detachably connected to the support plate 22, and, the guide post 23 is detachably connected to the limiting mechanism 25. When assembling the back plate clamping device, the guide post 23 is firstly connected to the retraction limiting mechanism 25, then, the guide post 23 is inserted into the guide mechanism 26 of the stand 21, and finally, the guide post 23 is connected to the support plate 22; alternatively, the guide post 23 is firstly connected to the support plate 22, then, guide post 23 is inserted into the guide mechanism 26 of the stand 21, and finally the retraction limiting mechanism 25 is connected to the guide post 23.

In a preferred embodiment, the elastic support structure 24 can be a spring, an elastic strip, or other elastic element that is capable of providing an elastic support. Suitable elastic support structure 24 will be chosen by taking, factors including size and weight of the back plate 3, size of the back plate clamping device and travel time of the back plate clamping device, etc., into consideration.

Exemplarily, as shown in FIG. 1, FIG. 2, FIG. 3, FIG. 4 and FIG. 5, a spring fits over the guide post 23. The spring is positioned between the stand 21 and the support plate 22, and fits over the guide post 23 of the support plate 22. During the operational process of the back plate clamping device, the spring will be forced to be compressed in an axial direction of the guide post 23 when the support plate 22 moves downwardly relative to the stand 21 in a direction perpendicular to back plate 3. The compression process is finished until the stand 21 reaches a predetermined location. The spring is chosen so that, when the compression process is finished (namely, when the stand reaches the predetermined location), the elastic force from the spring is not enough to damage the back plate 3, but it will take off the overpressure caused by uneven stress.

Exemplarily, as shown in FIG. 3 and FIG. 4, the stand 21 is formed with a groove 210 by which the spring is restricted. The groove 210 plays a role in restricting position of the spring so that the spring will not deflect when it is forced to be compressed in the axial direction of the guide post 23.

Embodiments of the present invention further provide an alignment device comprising the abovementioned back plate clamping device. Since the abovementioned back plate clamping device allows the back plate 3 to be suffered from a stress evenly during a clamping operation, so as to avoid fragments generated due to partial overpressure caused by uneven stress, the alignment device comprising the abovementioned back plate clamping device can reduce a possibility of damaging the back plate 3 and improve the productivity.

In addition, embodiments of the present invention further provide an evaporation equipment comprising the abovementioned alignment device. The evaporation equipment comprising the abovementioned alignment device can improve the productivity since the abovementioned alignment device can reduce damages of the back plate 3.

Obviously, it would be appreciated by those skilled in the art that various changes or modifications can be made in these embodiments without departing from the principles and spirit of the present invention. As a result, the present invention intends to contain these changes or modifications therein if they fall into the scope of the present invention which is defined in the claims and their equivalents.

What is claimed is:

1. A back plate clamping device comprising:
a framework,
an upper clamping plate mounted to the framework, and
a lower clamping plate assembly comprising a stand, a plurality of support plates and a plurality of elastic support structures that are provided in an one-to-one correspondence with the support plates, wherein,
each of the elastic support structures is positioned between a corresponding one of the support plates and the stand and is connected to the corresponding one of the support plates and the stand;
a surface of each of the support plates facing away from the corresponding elastic support structure is formed with a supporting face for supporting a back plate, and, each of the support plates is mounted to the stand and is movable in a direction perpendicular to a plane where the supporting face is located; and
the stand is mounted to the framework and is movable in the direction perpendicular to the plane; and
wherein,
a guide post, of which an extension direction is perpendicular to the supporting face, is provided on a surface of the support plate opposing to the support face, and,
a guide mechanism, which cooperates with the guide post to restrict a moving direction of the support plate, is provided on the stand, wherein, the guide mechanism comprises a through hole formed in the stand and a guide sleeve provided on the stand, wherein, the guide post passes through the through hole while the guide sleeve fits over the guide post.

2. The back plate clamping device according to claim 1, wherein, a recess is formed at a marginal portion of each of the support plates and each recess has a bottom collectively forming the supporting face.

3. The back plate clamping device according to claim 1, wherein, a retraction limiting mechanism is provided at an end of the guide post passing through the guide mechanism.

4. The back plate clamping device according to claim 3, wherein, the guide post is detachably connected to the support plate, and/or, the guide post is detachably connected to the retraction limiting mechanism.

5. The back plate clamping device according to claim 1, wherein, the elastic support structure comprises a spring.

6. The back plate clamping device according to claim 5, wherein, the spring fits over the guide post.

7. The back plate clamping device according to claim 5, wherein, the stand is formed with a groove by which the spring is restricted.

8. An alignment device, comprising the back plate clamping device of claim 1.

9. An evaporation equipment comprising the alignment device of claim 8.

* * * * *